United States Patent [19]
Barth, Jr. et al.

[11] Patent Number: 5,241,500
[45] Date of Patent: Aug. 31, 1993

[54] METHOD FOR SETTING TEST VOLTAGES IN A FLASH WRITE MODE

[75] Inventors: John E. Barth, Jr., Williston; Howard L. Kalter, Colchester, both of Vt.

[73] Assignee: Internal Business Machines Corporation, Armonk, N.Y.

[21] Appl. No.: 922,597

[22] Filed: Jul. 29, 1992

[51] Int. Cl.⁵ ............................................. G11C 7/00
[52] U.S. Cl. ............................... 365/189.01; 365/201; 365/203; 371/21.1
[58] Field of Search ................... 365/189.01, 203, 201, 365/200, 149; 371/21.1

[56] References Cited

U.S. PATENT DOCUMENTS

| | | | |
|---|---|---|---|
| 4,885,748 | 12/1989 | Hoffmann et al. | 371/21.3 |
| 4,965,769 | 10/1990 | Etoh et al. | 365/149 |
| 4,991,139 | 2/1991 | Takahashi et al. | 365/201 |
| 5,003,510 | 3/1991 | Kamisaki | 365/189.01 |
| 5,046,049 | 9/1991 | Choi et al. | 365/201 |
| 5,140,553 | 8/1992 | Choi et al. | 365/201 |

FOREIGN PATENT DOCUMENTS 0264893 4/1988 European Pat. Off.
2232774A 2/1990 United Kingdom.

OTHER PUBLICATIONS

IBM Technical Disclosure Bulletin "Multiple Word Line Selection For Reducing Semiconductor Memory Test Time", vol. 33, No. 5 (Oct. 1990).

Primary Examiner—Eugene R. LaRoche
Assistant Examiner—Andrew Tran
Attorney, Agent, or Firm—Heslin & Rothenberg

[57] ABSTRACT

A method is provided for flash writing to multiple cells of a memory array. Initially, a first set of word lines, each of which controls connection of a memory cell of a first set of memory cells to a first bit line of a bit line pair, is turned on. The voltage between the two bit lines of the bit line pair is then equalized so that the charge on the first bit line of the bit line pair is higher than the charge on the second bit line of the bit line pair. Next, a sense amplifier attached to the bit line pair is turned on to sense a difference in charge between the bit line pair and to charge the first set of memory cells. Then a second set of word lines, each of which controls connection of a memory cell of a second set of memory cells to the second bit line is turned on. Finally, the word lines previously turned on are shut off and then the sense amplifier is shut off. Additionally, an apparatus is provided which allows for: turning on multiple word lines at one time, keeping an equalization means on until after at least one set of word lines have gone on, and controlling the operation of the sense amplifier to turn on and shut off at appropriate times.

15 Claims, 11 Drawing Sheets

Ex. 4 Addresses
A0-A3, n=3
16 WLs, W0-15
$2^3$ = 8 Pre-Decodes (PD0-7)

METHOD FOR SETTING TEST VOLTAGES IN A FLASH WRITE MODE

TECHNICAL FIELD

This invention generally relates to the field of integrated circuit memory devices, and, more particularly, to a method and apparatus for flash writing to multiple memory cells of a memory device such as a dynamic random access memory (DRAM) for testing and stressing purposes.

BACKGROUND ART

As semiconductor memory devices, in particular DRAMs, increase in storage capacity and become more highly integrated, the need to quickly and effectively test the devices has become an increasingly important consideration in their design and manufacture.

The storage capacity of semiconductor memory devices, and in particular DRAMs, has on the average tended to quadruple every three to four years. While the memory capacity of DRAMs has steadily increased, the actual area on a semiconductor wafer occupied by a DRAM has remained relatively stable. Consequently, the elements which make up the DRAM have undergone substantial reductions in size over the years.

With these developments, several problems have arisen. The reduced size of the elements making up the DRAM has created an increased likelihood of defects in the end product. Also, the increased capacity of the DRAMs has substantially increased the time required to test the DRAMs for defects by conventional methods. It is known that the time required to perform such testing, depending upon the test patterns applied, increases at least by a factor of $2^N$ with an increase in storage size of a factor N.

The testing done quite often requires the loading of identical information into large numbers of the memory cells. For example, burn-in, a standard test conducted on memory devices at the time of manufacture, requires writing all highs or all lows to all of the memory cells at some time during the testing process. Burn-in tests consist of: a.) elevating the voltage in the memory cells of the DRAM to a potential of at least one or two volts above the normal voltage the DRAM would experience during normal operation; b.) placing the DRAM in an ambient temperature higher than it would normally experience; and c.) maintaining these conditions for a specified period of time. Burn-in is designed to stress test various oxide or dielectric connections found throughout the DRAM. Since the size of the various elements and layers on the DRAM, including the oxide layers, has decreased with each increase in memory capacity, the assuring of quality oxide and dielectric layers has become increasingly important.

Given the fact that normal DRAM operation allows access to relatively few memory cells at any one time conventional tests which use the normal data paths to conduct the tests can only test a few memory cells at any one time. When semiconductor memory devices had capacities of only 1 K, 4 K, 16 K, etc., the time needed to complete the tests did not create any serious problems. However, nowadays, with memory devices having capacities of 4 MB, 16 MB, etc., conventional methods of testing are costly and time consuming.

Various methods to simultaneously write to multiple memory cells, known as flash writing, have been developed over the years. Some of the solutions to the DRAM testing problem have involved the fabrication of additional data paths to the bit lines of the memory array to provide an alternate path into the memory cells for flash writing. United Kingdom Patent GB2,232,744 provides an example of this approach. However, given the large number of bit lines in the memory array, the extra circuitry required adds additional unwanted complexity to the design and consumes an inordinate amount of space on the DRAM. Another alternative proposed involves adding additional circuitry to the column decoder of the memory array. Such additional circuitry would augment the capabilities of the column decoder so that the normal data paths could provide the channel for simultaneously writing to multiple memory cells. U.S. Pat. No. 4,991,139 provides an example of this approach. However, use of the augmented column decoder and normal data paths has the same disadvantages as using separate data paths to the bit lines. The circuitry required adds substantial complexity to the DRAM and requires substantial amounts of additional scarce space on the chip.

The challenge, thus, remains of providing a method for flash writing a DRAM for test purposes in a way that adds a minimal amount of extra circuitry and complexity to the structure of the DRAM.

DISCLOSURE OF INVENTION

The present invention provides a method for writing simultaneously to multiple memory cells of a memory array without the need of additional data paths and with a minimal amount of additional circuitry. Further, the additional circuitry does not add any substantial complexity to the manufacturing process or resulting structure of the DRAM.

In accordance with the principles of the present invention, a method for simultaneously setting voltages in a plurality of memory cells of an integrated circuit memory module is provided. The method involves turning on a first set of word lines, each word line controlling connection of a cell of a first set of memory cells to a first bit line of a pair of bit lines; equalizing the voltage between the two bit lines of the bit line pair so that the charge on the first bit line of the bit line pair is higher than the charge on the second bit line of the bit line pair; and turning on a sense amplifier attached to the bit line pair to sense this difference in charge between the bit line pair and to charge the first set of memory cells. After the first set of memory cells are charged, the first set of word lines are shut off.

In a further aspect of the method of the present invention, a second set of word lines, each attached through a cell of a second set of memory cells to the second bit line of the bit line pair is turned on after the first set of memory cells are charged and prior to shutting off the first set of word lines. The second and first sets of word lines can be shut off together and then the sense amplifier is shut off so that the charge induced in the memory cells is retained.

In a further aspect of the present invention, the step of equalizing is terminated after the first set of word lines is turned on but before the sense amplifier is turned on to assure retention of the charges in the memory cells along the first bit line.

In another aspect of the present invention, apparatus for flash writing to a plurality of memory cells of a semiconductor memory device is provided. The apparatus, includes a bit line pair with the first bit line and the second bit line of the bit line pair connected to a sense amplifier and an equalizer. A first set of word lines are connected to the first bit line through a first plurality of memory cells and a second set of word lines are connected to the second bit line through a second plurality of memory cells. Circuitry is provided for: turning on the first set of word lines while keeping the second set of word lines shut off; keeping the equalizer on while the first set of word lines turn on and then for shutting off the equalizer; turning on the sense amplifier after the equalizer shuts off; and turning off the first set of word lines.

In a further aspect of the present invention, circuitry is provided for turning on the second set of word lines after the sense amplifier has turned on and before the first set of word lines has turned off, and then for turning off the first and second sets of word lines.

BRIEF DESCRIPTION OF THE DRAWINGS

The foregoing and other aspects, features and advantages of the invention will be apparent from the following more particular description of a preferred embodiment of the invention as illustrated in the accompanying drawings in which.

BEST MODE FOR CARRYING OUT THE INVENTION

Introduction

The present invention facilitates flash writing to multiple memory cells of a DRAM without the need for extra data paths to the individual bit lines or additional circuitry for column decoding. The inherent ability of the DRAM to charge itself based on its internal structure is relied upon. Implementation requires some simple modifications and additions to the internal circuitry of the DRAM which can be easily accomplished during design.

The examples described herein involve a DRAM with folded pairs of bit lines connecting to a sense amplifier. DRAMs with memory arrays consisting of folded bit lines coupled to a sense amplifier make up one of the more common array structures used at the present time. However, those skilled in the art will readily applicate the applicability of the method of the present invention to other memory structures.

Figure 1:
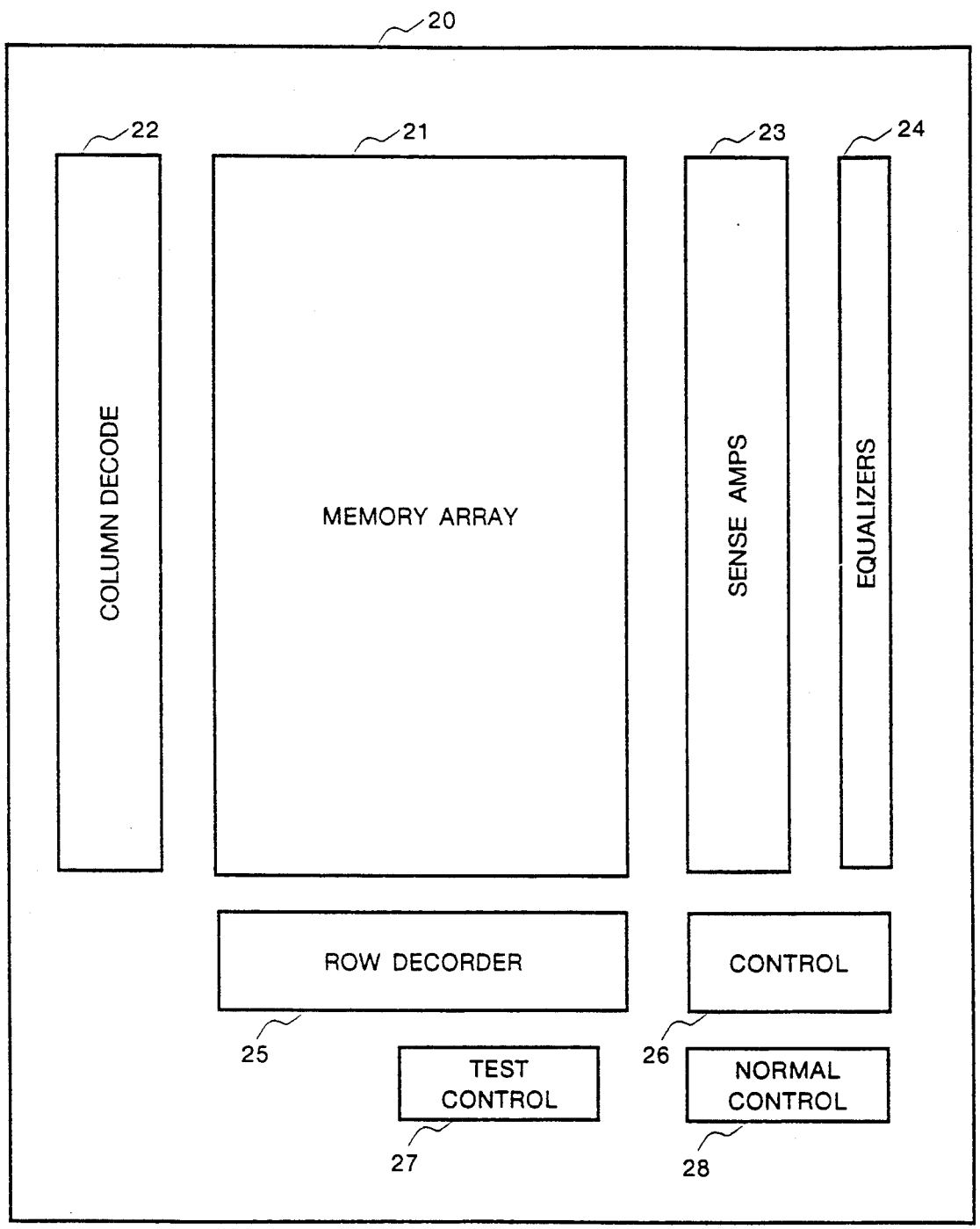
FIG. 1 provides an overall schematic view of the major components of a DRAM utilizing the test apparatus of the present invention.

FIG. 1 provides an overall schematic of a DRAM 20 fabricated in accordance with the principles of the present invention. The major functional parts of the DRAM which remain unaltered for the present invention are a memory array 21, a bank of sense amplifiers 23, a bank of equalizers 24, standard column decode circuitry 22, and normal control functions 28. For implementation of a preferred embodiment of the present invention, elements of a conventional DRAM are modified in order to allow: the row decoder 25 to select simultaneously multiple word lines; the control circuitry 26 to control and vary the timing of the bank of equalizers 24 and the bank of sense amplifiers 23; and the test circuitry 27 to control and coordinate the flash writing of the present invention.

Memory cells connected to pairs of folded bit lines make up the memory array 21 in a standard fashion familiar to those skilled in the art. The cells of the memory array form a matrix with a plurality of bit line pairs. Each bit line pair, composed of a true bit line and a complementary bit line, have many memory cells connected thereto along their respective lengths. The bit line pairs also connect to a specific sense amplifier in the sense amplifier bank 23 and a specific equalizer in the equalizer bank 24 in the normal fashion. A plurality of word lines cross over the bit lines and periodically connects to the gates of control transistors in the memory cells.

Information written into memory cells along the true bit line of the bit line pair is outputted by the DRAM without inversion. Thus, a 1 stored in a true memory cell will output as a 1 and likewise for a 0. However, because of the makeup of a bit line pair and its scheme of operation, well-known in the art, a 1 stored in a cell along the complementary bit line is read out as a 0 or low and a 0 or low stored in a memory cell along the complementary bit line is read out as a 1 or high.

Figure 2:
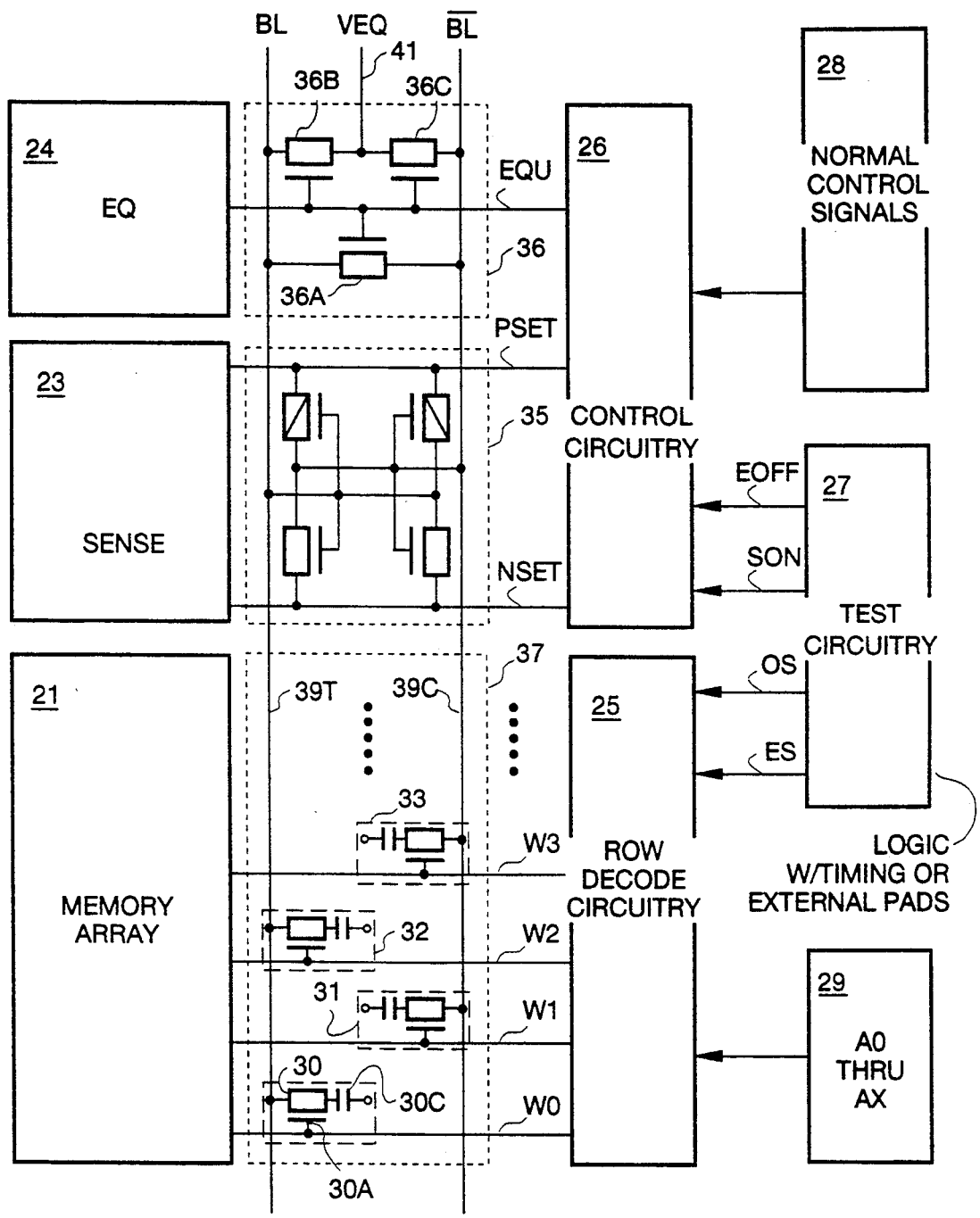
FIG. 2 depicts a relevant portion of the circuitry of a DRAM embodying one version of the present invention.

The structure of the DRAM is common knowledge to those skilled in the art and only that portion of one bit line pair and the devices connected to it needed to explain the present invention appear in FIG. 2. FIG. 2 depicts a portion of one folded bit line pair consisting of a true bit line 39T and a complementary bit line 39C connected to a shared sense amplifier 35 and a shared equalizer 36. Memory cells 30 and 32, two of the many memory cells that connect to true bit line 39T along its length, also connect in standard fashion to even word lines W0 and W2, respectively. Each memory cell connected to the true bit line 39T has an even word line attaching to it. Memory cells 31 and 33, two of the many memory cells that connect to complementary bit line 39C along its length, also connect in standard fashion to the odd word lines W1 and W3, respectively.

Each memory cell connected to the complementary bit line 39C has an odd word line attached to it. In the structure presented, the odd word lines control the memory cells connected to the complementary bit line 39C and the even word lines control memory cells connected to the true bit lines 39T.

Figure 3:
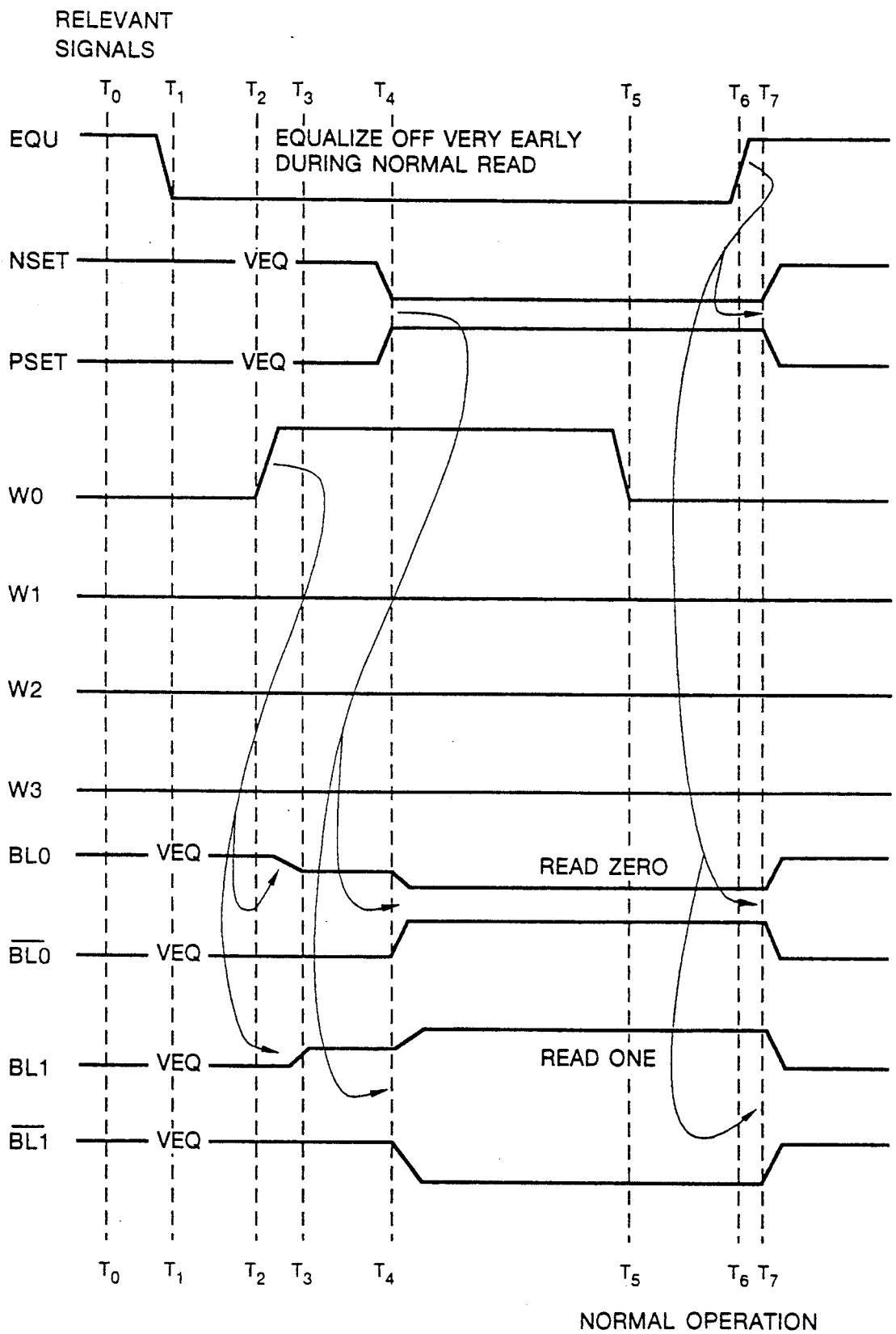
FIG. 3 presents a timing diagram depicting some of the major signals of a DRAM during a normal read operation.

During a normal read or write cycle of the DRAM, the test circuitry 27 is not used. Normal control signals, depicted schematically by box 28, applied to control circuitry 26, and address lines 29 connected to the row decode circuitry 25, control the operation of the DRAM. The timing diagram of FIG. 3 illustrates at time $T_0$ the position of the relevant signals at the beginning of a normal operation, such as a read operation. At this point of the cycle, the equalization signal EQU, at an active high, has turned the equalizer on. The equalizer, operating in a fashion well-known in the art, equalizes the potential of both bit lines to the same voltage level. Consequently at time $T_0$, the bit lines indicated as BL0 and $\overline{BL0}$ when the cells to be read are logical 0's or, BL1 and $\overline{BL1}$ when the cells to be read have logical 1's, are equalized at a potential VEQ midway between the high and the low state normally read on the bit lines.

Referring back to FIG. 2, the equalization process will now be described in greater detail. Equalization of the bit lines 39T and 39C occurs when the equalizer 36 turns on upon receipt of a high equalization signal EQU. This, in turn, turns on the three transistors 36A, 36B and 36C of equalizer 36. By turning on the transistors of the equalizer, the bit lines directly connect in a closed circuit through transistor 36A. Also, voltage equalizing signal VEQ on line 41 connects into both bit lines 39T and 39C through transistors 36B and 36C, respectively, and sets the potential of the true bit line 39T and complementary bit line 39C to the desired potential VEQ. In this example, the bit lines are equalized at a potential midway between the high and the low of the system. Some systems in use equalize at a high or a low level, however, the method of the present invention can just as easily operate on those systems.

Referring back to FIG. 3, at time $T_1$, the equalizer shuts off before any other activity occurs. When the equalizer shuts off, the two bit lines 39T and 39C disconnect from each other but remain set at the same potential until otherwise changed. At time $T_2$, the appropriate address received by the row decode circuitry 25 turns on the selected word line. In the example set forth in FIG. 3, word line W0 turns on and creates a voltage potential at transistor gate 30A of cell 30 (FIG. 2), thus, establishing a connection between capacitor 30C in memory cell 30 and true bit line 39T. If a 0 or a low voltage reading is stored in capacitor 30C, this causes a slight decrease in the potential of bit line 39T as depicted at time $T_3$ (FIG. 3) on line BL0. On the other hand, if a 1 or high voltage is stored in capacitor 30C, a slight increase in the potential or charge on the bit line 39T occurs, as indicated at line BL1 (FIG. 3) at time $T_3$.

At time $T_4$ the sense amplifier switches on and the NSET signal drops from a equalized state to a low or 0 and the PSET signal goes from the equalized level to a high or 1. The sense amp will then sense the charge that was transferred to bit line 39T from capacitor 30C. This occurs at or shortly after time $T_4$. If a 0 is stored in capacitor 30C, then the true bit line drops to 0, as indicated by line BL0 in FIG. 3. If, on the other hand, there is a high charge or 1 in capacitor 30C, then the true bit line rises to a full 1 or a high potential, as indicated by line BL1 at time $T_4$. Then at some point between time $T_4$ and time $T_6$ the appropriate reading of the true bit line for the information contained thereon occurs. The construction and functioning of a sense amplifier is well-known in the art and accordingly is not described herein in further detail.

By time $T_5$ the sense amplifier either recharges the capacitor 30C back to its high 1 state or back to its low 0 state, and then at time $T_5$, the word W0 line shuts off, as indicated in FIG. 3. At this point, the restoration of the memory cell has returned it to its original state. At time $T_6$ the equalization signal EQU goes high and turns on the equalizer which returns the bit lines to an equalized potential preparing them for the next read or write cycle, as the case may be. At time $T_7$, the NSET signal and PSET signal shut off and return to an equalized state VEQ.

Implementation of the Present Invention using External Test Pads

A description of an implementation of the present invention using test terminals or pads on the DRAM while still in wafer form is now presented.

The present invention adds four new control signals for the purpose of altering the normal sequence of some of the signals encountered during the operation of the DRAM and to turn on multiple word lines. FIG. 2 indicates an ES signal and OS signal running from the test circuitry 27 to the row decode circuitry 25. The ES or even word line select turns on all of the even word lines simultaneously. The OS or odd word line select turns on all of the odd word lines simultaneously. The even word lines depicted in FIG. 2 as W0 and W2 connect to and turn on all of the memory cells which also connect to the true bit lines such as 39T. The odd word lines depicted as W1 and W3 in FIG. 2, in turn, connect to and turn on all of the memory cells which connect to the complementary bit lines such as 39C.

An EOFF signal generated by the test circuitry 27 is transmitted to the control circuitry 26. The EOFF signal changes the timing of the equalization signal EQU which, in turn, activates the equalizer. The EOFF signal keeps the equalization signal EQU on and, thus, the equalizer on until after either the ES signal or the OS signal has activated and turned on either the even or odd word lines, respectively. Once the even or odd word lines turn on, then the EOFF signal shuts off, deactivating the equalization signal EQU and, thus, shutting off the equalizer. The shutting off of the equalizer occurs prior to the sense amplifier being turned on by a set on signal SON. Additionally, the SON signal generated by the test circuitry delays the turning on of the sense amplifier and also provides for turning on the NSET signal prior to the turning on of the PSET signal. It will be noted from FIG. 3 that during normal operation, the NSET signal and PSET signal turn on at the same time. For the purpose of this invention, however, to cause an imbalancing in the sense amplifier, the NSET signal is turned on before the PSET signal. The NSET signal activates transistors which drain charge from the bit lines and the PSET signal activates transistors which charge the bit lines. Sense amplifiers and their operation are well-known in the art.

Briefly, the flash writing process of the present invention provides for first turning on the equalization circuitry 36 of FIG. 2 to equalize the word lines are then turned on. This, in effect, causes the capacitors in he memory cells along the true bit line, controlled by the even word lines, to connect to the true bit line. After the appropriate period of time has passed, allowing the capacitors on the true bit line to charge, the equalization circuitry 36 shuts off. Then the sense amplifier 35 turns on. The sense amplifier senses the capacitive difference between the even bit lines 39T with a high capacitance, because it has all of its memory cell capacitors connected to it and charged, and the complementary it line 39C which lacks substantial capacitance because none of its memory cell capacitors are connected to it. Consequently, the sense amplifier assures a charge of a high or 1 in all of the capacitors attached to the true bit line 39T.

The sense amplifier ultimately charges all of the memory cells along the true bit line 39T in the sample given, as a result of the NSET signal activating before the PSET signal. The NSET signal, when it activates, starts draining charge from both the true bit line 39T and from the complementary bit line 39C. Although initially both bit lines have an equal potential, the charge on the complementary bit line 39C becomes exhausted much quicker than the charge on the true bit line 39T because of the higher capacitance along the true bit line 39T. Consequently, a difference in the potential between the true bit line 39T and the complementary bit line 39C arises. This difference in potential causes the sense amplifier to charge the true bit line 39T and its memory cells to a high and to charge the complementary bit line to a low. Once the sense amplifier senses the difference in potential, if the odd word lines controlling the memory cells along the complementary bit line are turned on, then the memory cells along the complementary bit line will be charged by the sense amplifier to a low or 0. The opposite effect of charging all the memory cells along the complementary bit line to a high or 1 and those along the true bit line to a low or 0 can be achieved by turning on the odd word lines during the equalizing phase and not turning on the even word lines until the sense amplifier is fully functional.

Figure 4:
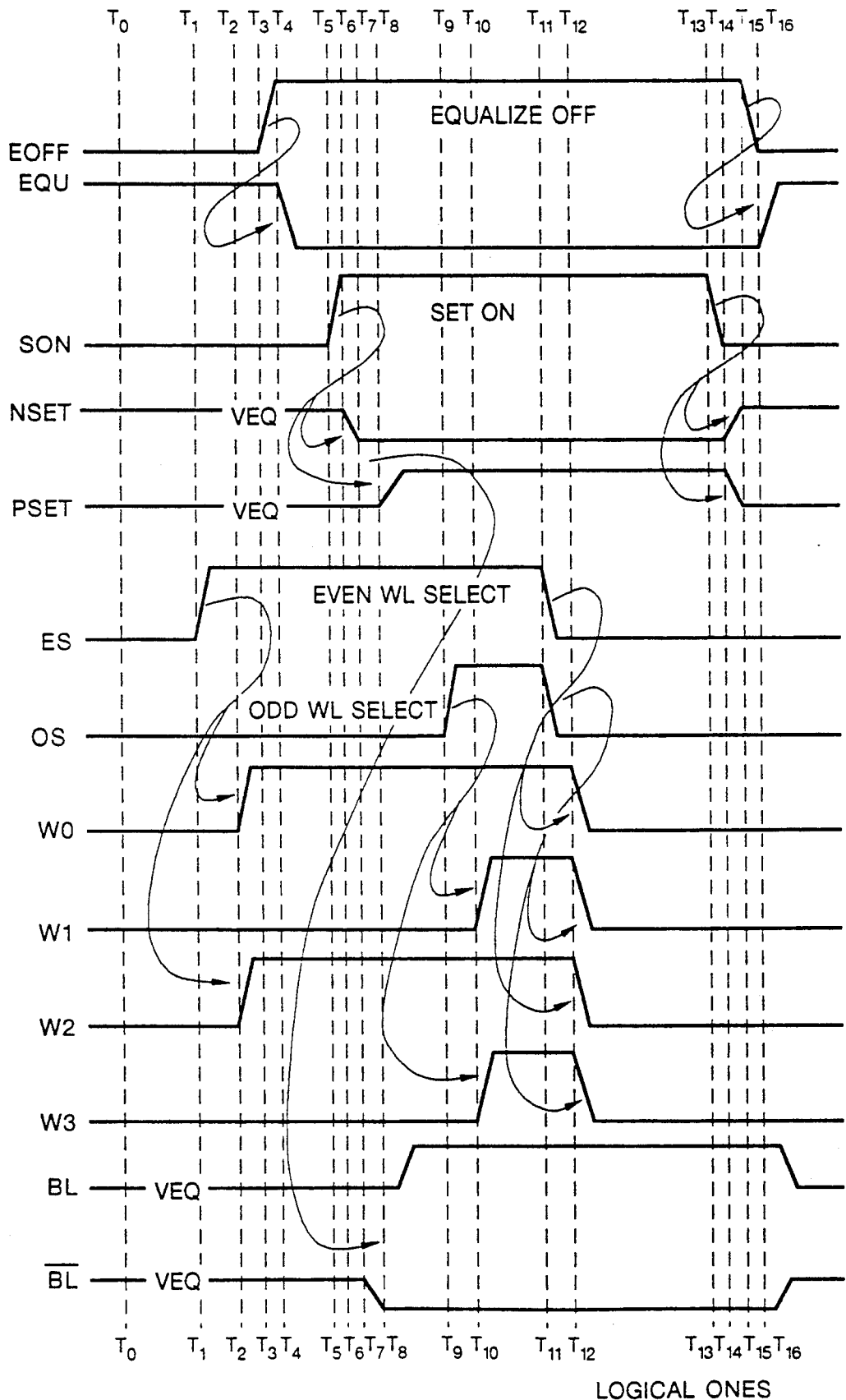
FIG. 4 presents a timing diagram depicting the sequence of the relevant signals when the apparatus of the present invention simultaneously charges all of the cells of the memory array with logical 1's.

A more detailed description of the method of the present invention follows. FIG. 4 depicts the sequence of signals used to simultaneously flash write logical 1's to the entire memory array. This results in a real 1 or high being written to all of the memory cells connected to the true bit lines and a real low or 0 being written to all of the memory cells attached to complementary bit lines. The first step indicated at $T_0$ provides for the equalization circuitry to be on, as indicated by the high EQU signal. The new signal EOFF or equalization off turns on, i.e., goes to a high state, and keeps the EQU signal high until after time $T_4$. At time $T_1$ the ES signal, or even word line select signal, turns on. This activates all of the even word lines, e.g., W0 and W2, which then go high at time $T_2$. The even word lines activate the gates of the transistors controlling access to the memory cells attached to the true bit lines. This connects the capacitors in these memory cells to the true bit line. Consequently, with the equalization circuitry still on, the effect of equalizing the two bit lines also charges the capacitors in each memory cell connected to a true bit line to the same potential as both bit lines. The equalization signal EQU remains on for a sufficient period of time to allow the full charging of all of the capacitors in the memory cells attached to the true bit line. Subsequently, at time $T_4$ the EQU signal goes low and shuts off the equalization circuitry. The EQU signal goes low in response to the EOFF signal going high at time $T_3$.

Subsequently, at time $T_5$ the SON signal goes high and activates the sense amplifier. However, the SON signal first turns on only the NSET signal at time $T_6$. When the NSET signal goes low at time $T_6$ it only activates the portion of the sense amplifier which drains charge from the bit lines. Subsequently, the SON signal, through an appropriate delay, causes the PSET signal to go on at time $T_8$ after the NSET signal has become fully active at time $T_7$. As noted above, the effect of this delay between the NSET signal and PSET signal is to slightly unbalance the bit lines and urge the sense amplifier to change to a high state the bit line with higher capacitance which, in the example given, is the true bit line. As noted above, the NSET signal starts that portion of the sense amplifier operation that drains charge from both the true bit line and the complementary bit line. Since there is a much higher capacitance along the true bit line, the true bit line will take much longer to discharge. Consequently, when the PSET signal goes on at time $T_8$, the sense amplifier senses the difference in potential created between the true bit line and complementary bit line; all or most of the charge having drained out of the complementary bit line but the true bit line still remaining at a relatively high potential due to the excessive capacitance. The sense amplifier then proceeds through its normal operation and charges all of the memory cells attached to the true bit lines to a high 1.

In order to assure that all of the memory cells along the complementary bit line are charged to a low or 0 state, the OS or odd word line select signal goes high, as indicated at time $T_9$. This, after the normal delay, turns on all of the odd word lines, e.g., W1 and W3, at time $T_{10}$. However, since the sense amplifier has already been biased in favor of the true bit line due to the higher capacitance, the true bit line and its memory cell capacitors will be charged to a high state by the sense amplifier, as indicated by signal BL, and the complementary bit line, as indicated by signal $\overline{BL}$ and its memory cell capacitors will be charged to a low or 0.

Subsequently, at time $T_{11}$ both the odd and even word line selects are shut off. Thus, at time $T_{12}$ all of the word lines shut off. However, it will be noted that it is not necessary to simultaneously turn them all off, although in the normal course of operations, both sets would turn off at the same time.

At this point, all of the memory cells attached to true bit lines have a high charge or 1 and all of the memory cells attached to a complementary bit line have a low charge or 0. Subsequently, at time $T_{13}$ the SON signal shuts off which correspondingly shuts off both the NSET and PSET signals at time $T_{14}$. Thus, the sense amplifier shuts off. Subsequently, at time $T_{15}$ the equalize off signal EOFF goes low and turns on the equalization signal EQU at time $T_{16}$. Accordingly, the bit lines are then brought back to an equal potential state and the next cycle can commence.

Figure 5:
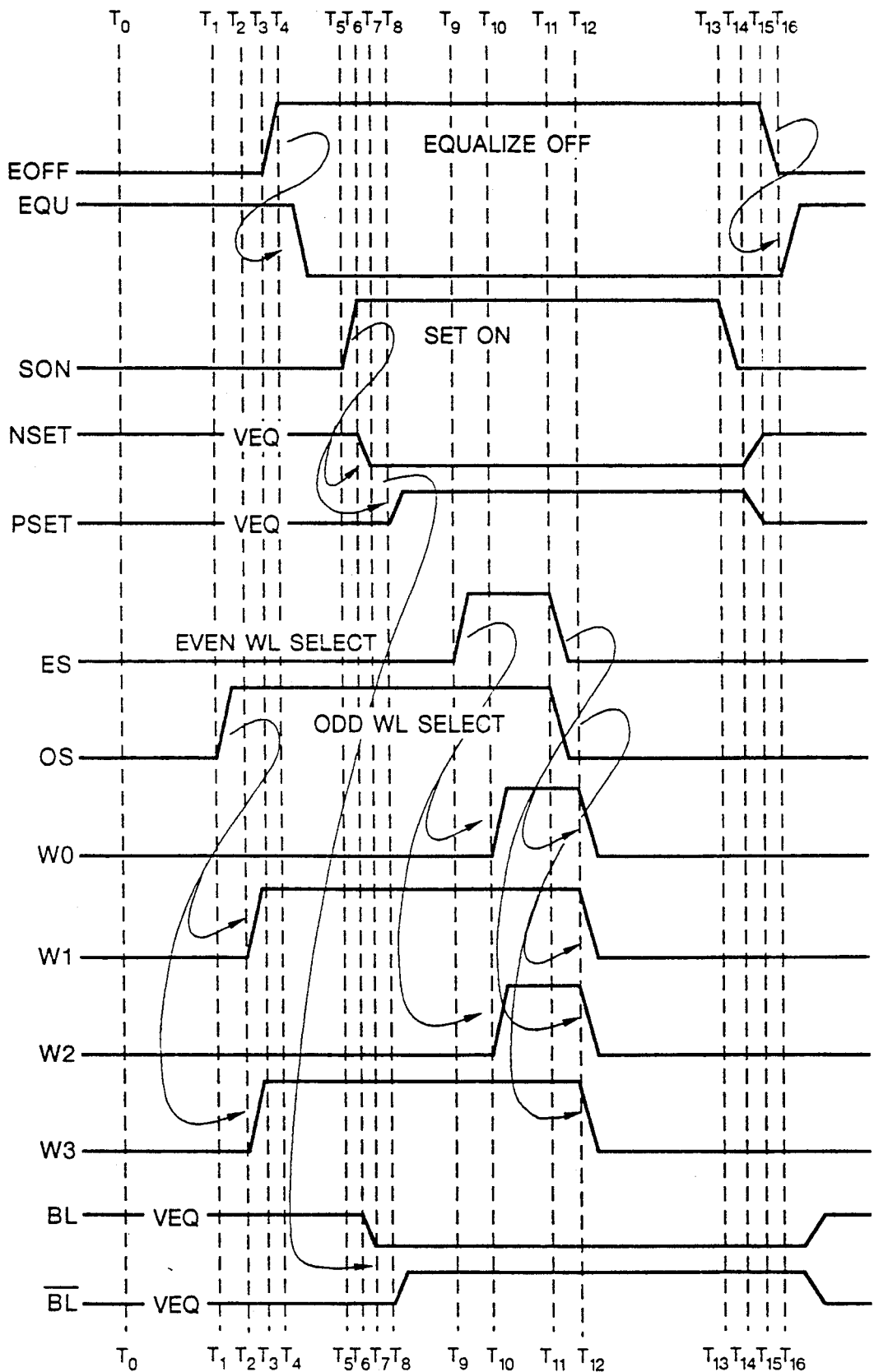
FIG. 5 present a timing diagram depicting the sequence of relevant signals when the apparatus of the present invention simultaneously charges all of the cells of the memory array with logical 0's.

A process very similar to the above can be used to charge all of the memory cells of the memory array to a logic 0. This, in effect, would put a low or 0 in all of the memory cells connected to the true bit lines and a high or a 1 in all of the memory cells connected to the complementary bit lines. FIG. 5 illustrates the sequence of signals necessary to charge all of the memory cells of the memory array to logical 0. FIG. 5, when compared to FIG. 4, illustrates the difference in the sequencing of signals necessary to charge the cells to a logical 0. The differences being that at time $T_1$ instead of having the ES or even word line select go high, the OS or odd word line select goes high. This turns on all of the odd word lines connected to memory cells which, in turn, connect to the complementary bit lines of the memory array. All of the other signals are similar except for the ES signal which turns on at $T_9$ and turns on the even word lines at time $T_{10}$. Obviously, by turning on the odd word lines first, the capacitors in all of the memory cells along the complementary bit lines connect to the complementary bit lines and charge during the equalization phase. The capacitors in the memory cells attached to the complementary bit lines charge to the same potential as both bit lines. This over capacitance along the complementary bit lines then results in the sense amplifier sensing the higher capacitance along the complementary bit line and then proceeding through a process of charging those memory cells on the complementary bit lines to a high or 1 and, ultimately, the cells along the true bit line charge to a low or 0.

Those skilled in the art will readily understand that the OS, ES, EOFF and SON signals may be provided in a number of different ways. A direct wiring scheme using pads or test terminals on the wafer which makes up the DRAM before enclosure of the wafers in a module provides one possibility. One method of implementing the ES and OS signals with a direct wiring scheme would provide pads or test terminals, with one pad directly wired to all of the even word lines and another pad directly wired to all of the odd word lines. Generation of the OS and ES signals would occur outside of the DRAM, perhaps by appropriate test equipment well-known in the art. The OS signal or ES signal would be introduced at the appropriate time through the respective pad. Likewise, connection of the equalizer to a separate pad or test terminal would allow for the direct control of the equalizer by introducing the EOFF signal at the appropriate time through the pad connected to the equalizer. Also control of the sense amplifier by a direct line from a dedicated pad or test terminal is possible provided the line from the pad splits onto two lines with one line controlling the NSET line while the other line passes through a delay before controlling the PSET line. Thus, the SON signal would enter through the designated pad at the appropriate time.

Use of the flash write procedure only at the time of manufacture to test the memory device while still in wafer form with exposed pads or test terminals provides one possible situation for use of this wiring scheme. After the probing of the pads to conduct the test(s), enclosure of the wafers which successfully pass the test would occur. Completion of the manufacturing process would result in the sealing off of the pads connecting to the odd and even word lines. However, if extra pins were available on the module enclosing the wafer, the pads would be available for connection to the exterior world for future use. An advantage of the above scheme is that the tests can be conducted before the completion of the manufacturing process and, thus, elimination of defective wafers prior to their enclosure in modules would significantly reduce costs.

Implementation of the Present Invention using Logic with Timing Built into the Memory Device Another alternate version of the present invention, as described below, provides the DRAM with the necessary logic and timing circuitry built in at the time of manufacture.

A number of ways to implement the method of the present invention exist without the use of extra pins on the module. A number of these possible schemes would most likely make use of the standards promulgated by the Joint Electron Devices Engineering Council (JEDEC) on or about Apr. 22, 1987 in a paper entitled "Optimal Special Modes for Address Multiplexed DRAM," Ltr. BJC-42.3-86-95A (incorporated herein by reference). However, additional circuitry to implement the functions of the ES and OS signals as well as to implement the SON and EOFF signals must be added to implement the present invention. Implementation of the present invention with the JEDEC standards would avoid the need for extra pins on the module. Once the special mode circuitry based on the JEDEC standards is built into the chip together with circuitry to implement the present invention, activation of the flash write process would be by a change in the normal sequence of the row select signal, the column select signal and the write select signal together with the appropriate row address.

Figure 6:
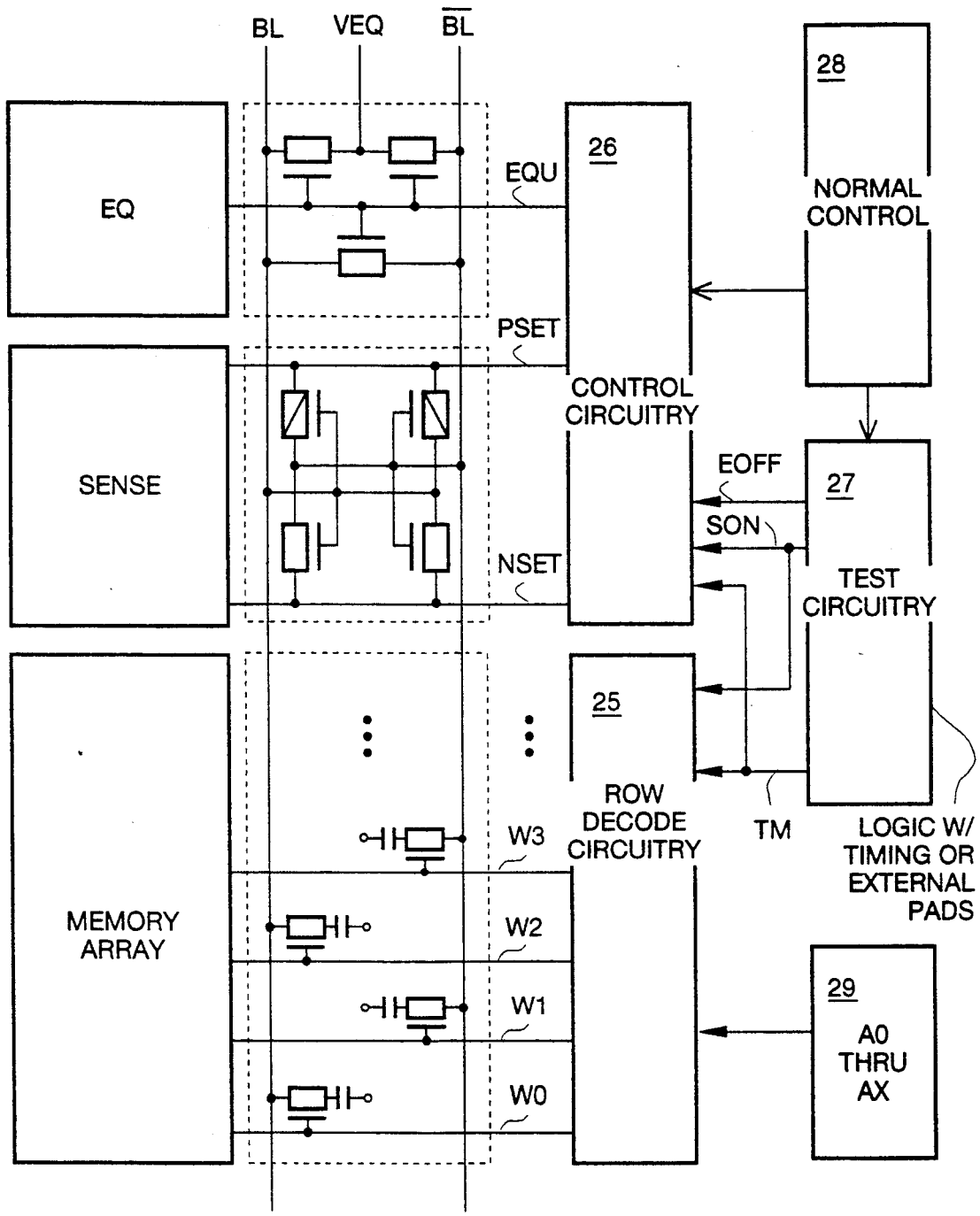
FIG. 6 depicts a relevant portion of the circuitry of a DRAM embodying an alternative implementation of the present invention.

FIG. 6 illustrates the changes necessary to the circuitry depicted in FIG. 2 to implement an alternative scheme using the JEDEC standards. FIG. 6 has eliminated the ES and the OS signals. They are replaced with a test mode (TM) signal. The TM signal is provided by test circuitry 27 to both row decoder circuitry 25 and control circuitry 26. Also, the SON signal is connected into the row decode circuitry 25 as well as into the control circuitry 26. The normal control signal circuitry 28 also connects into the test circuitry 27 as well as into the control circuitry 26.

Figure 7:
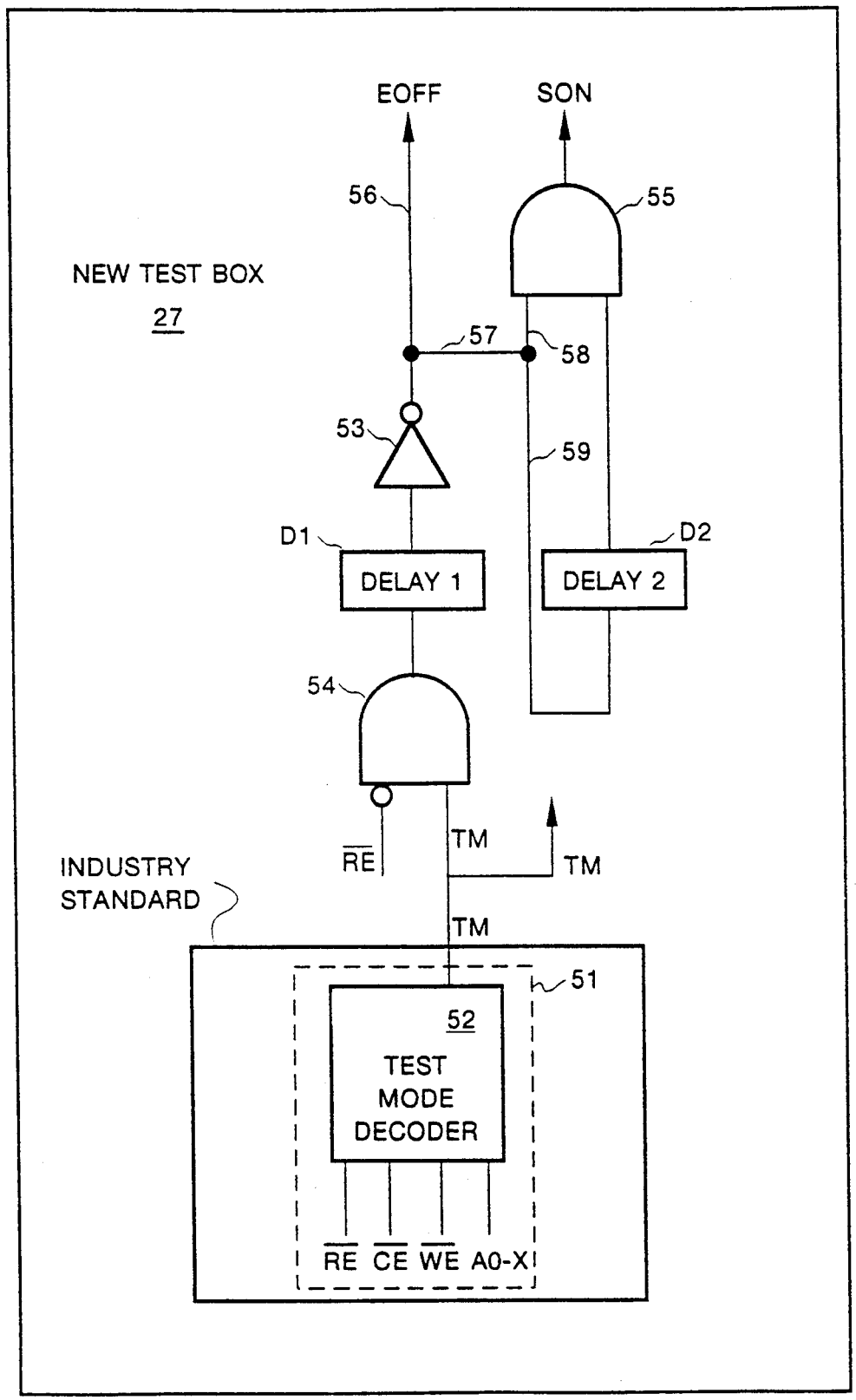
FIG. 7 illustrates one possible configuration of a portion of the test control circuitry depicted in FIG. 6

FIG. 7 depicts the test circuitry 27 of FIG. 6 which can be used to implement the method of the present invention. The standard test mode circuitry fabricated according to the JEDEC standards appears in dotted outline at 51. The correct sequence of the column select signal $\overline{CE}$, write signal $\overline{WE}$ and the row select signal $\overline{RE}$, together with the appropriate address number, A0-X, would activate a test mode decoder 52. This, in turn, would generate the test mode signal TM. The test mode signal TM, as indicated, branches off and connects to AND gate 54 as well as to other circuitry which will be described below. The TM signal combines with the row select signal $\overline{RE}$ in AND gate 54 and generates a signal which passes through a first delay circuit D1 and an inverter 53. On leaving inverter 53, the signal branches on to two different paths 56 and 57. On path 56, it becomes the EOFF signal. On the second path 57, the signal path again branches. On path 58, the signal is fed to a first input of an AND gate 55. On path 59, the signal passes through delay circuit D2 before entering AND gate 55. The output of AND gate 55 comprises the SON signal. As indicated in FIG. 6, the EOFF signal is transmitted to the control circuitry 26. The SON signal is transmitted to both the control circuitry 26 and the row decode circuitry 25. The TM signal is transmitted to both the row decode circuitry 25 and the control circuitry 26. The effect and purpose of the delay circuits will be discussed below upon review of the timing diagrams.

Figure 8:
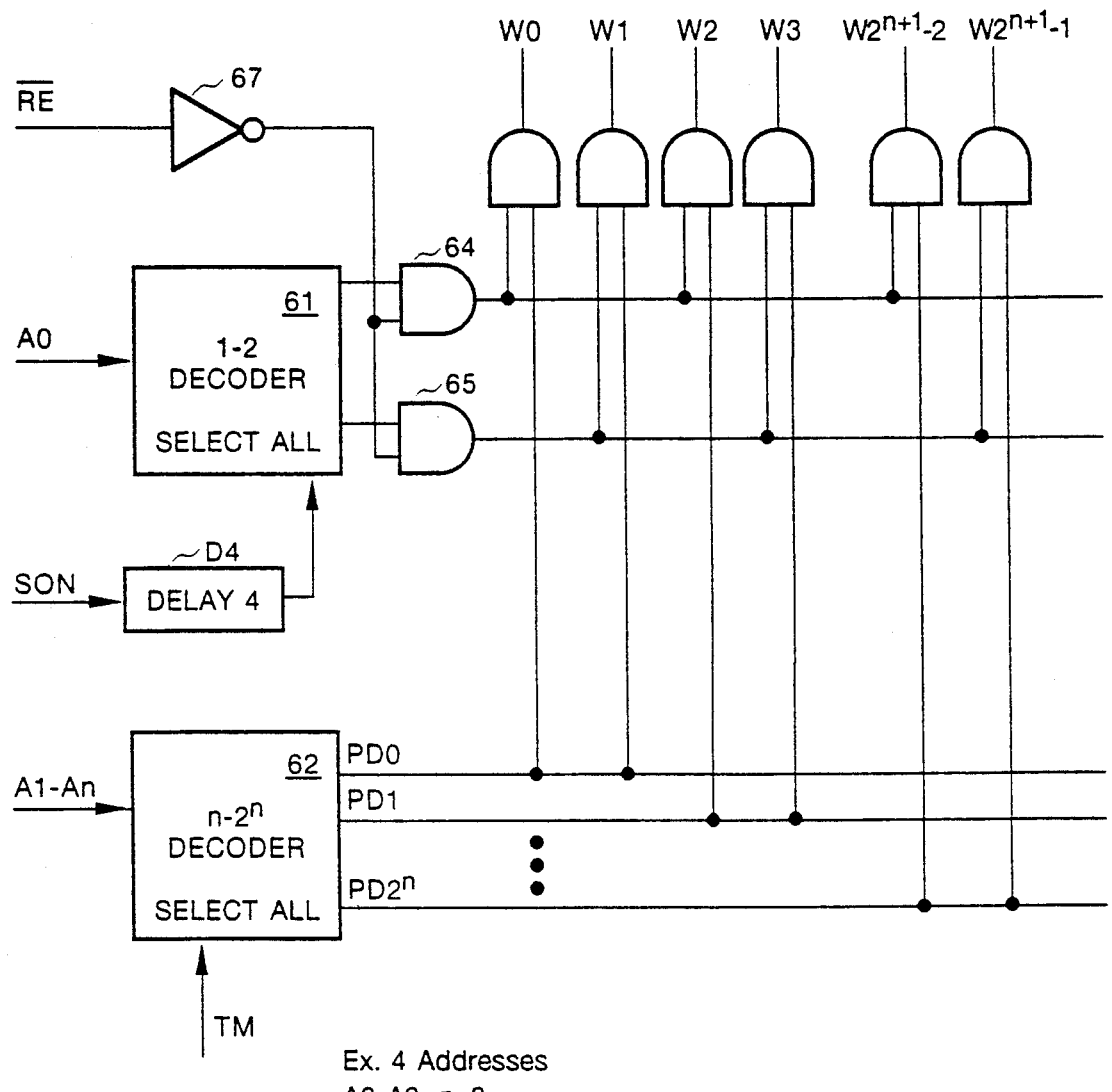
FIG. 8 illustrates one possible configuration of a portion of the row control circuitry of FIG. 6.

FIG. 8 depicts some of the standard circuitry, with some modifications, which makes up the decode circuitry 25 of FIG. 6. Decoder 61 decodes the least significant address bit A0. Decoder 62, in turn, decodes address bits A1 through AN. Actual selection of word lines occurs when the $\overline{RE}$ signal after passing through inverter 67 combines in AND gates 64 and 65 with the signals output from the decoder 61. Activation of AND gate 64 with the appropriate signals would select all of the even word lines W0, W2, etc. Activation of AND gate 65 with the appropriate signals would select all of the odd word lines W1, W3, etc. During normal operations both the odd and even word lines would not be selected together. Also, during normal operations decoder 62 selects the actual word line, i.e., W0 to $W2^{n+1}-1$ activated. Activation would occur by transmission of a signal over one of the lines PD0 to $PD2^n$.

The necessary modifications to the circuitry in FIG. 8 to implement the present invention include the introduction of the SON signal through delay D4, into decoder 61. When decoder 61 receives either a high or a low bit over signal line A0, it would select either all the odd or even word lines. In turn, the delay signal coming over the SON line through delay circuitry D4 would allow selection of the unselected odd or even word lines at the appropriate time. Additionally, signal TM would allow appropriate circuitry in decoder 62 to select all of the word lines PD0 to $PD2^n$ and thus, either all the odd word lines or all the even word lines would turn on together. Subsequently the SON signal delayed by D4 would activate all the odd or even word lines not previously turned on, as the case may be.

Figure 9:
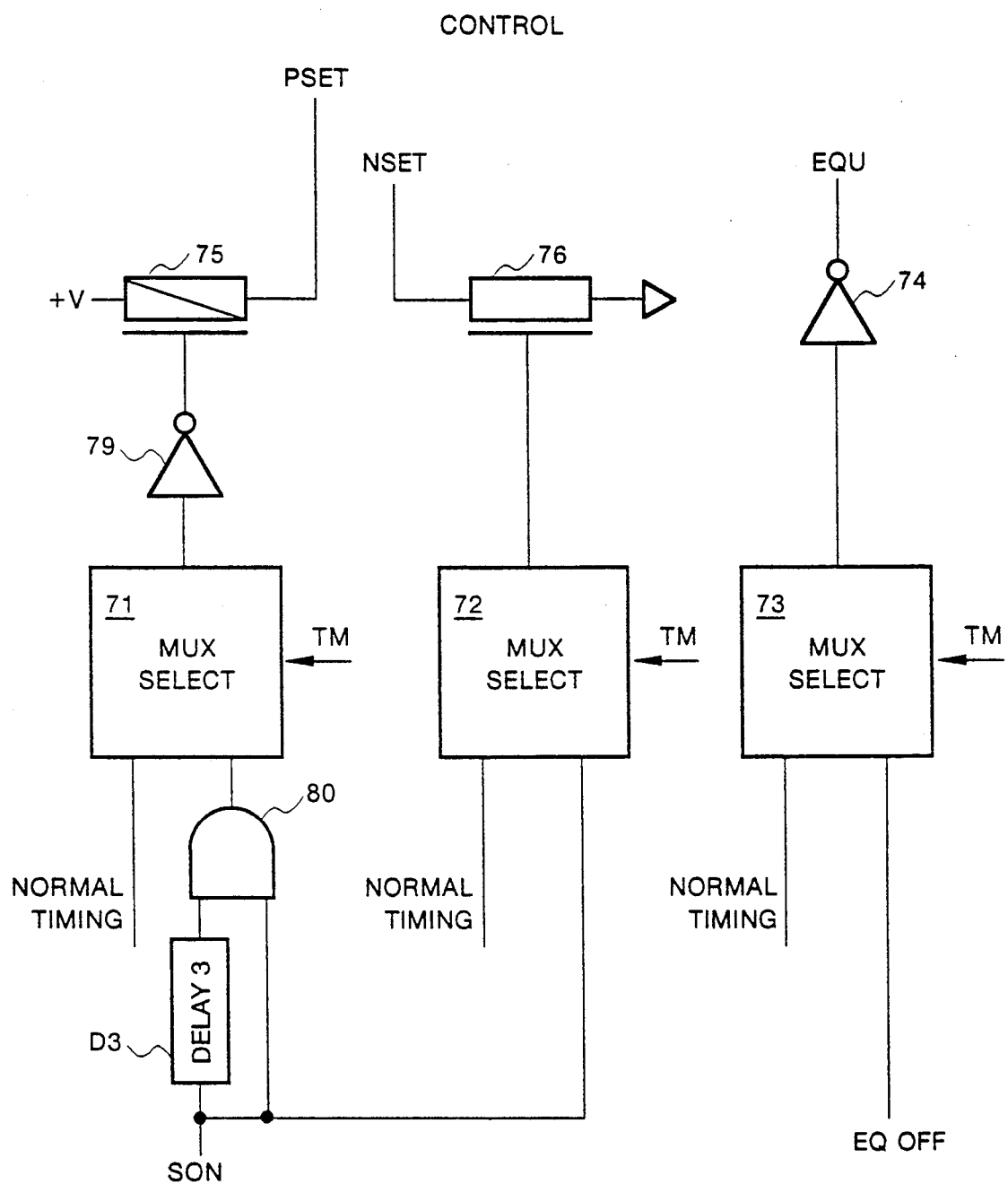
FIG. 9 illustrates one possible configuration of the portion of the control circuitry of FIG. 6 which controls the equalization and the PSET and NSE signals.

FIG. 9 depicts the circuitry, with necessary modifications to implement the present invention, making up the control circuitry 26 of FIG. 6. During normal operation of the DRAM, signal TM would not be active and, accordingly, multiplexer MUX 73 of FIG. 9 would allow the normal timing signals to control. Thus, the equalization signal EQU produced by the inverted signal from multiplexer MUX 73 would turn on the equalizer at the normal time and shut it off at the normal time. The equalizer would, accordingly, turn off prior to the word line being selected during a normal read or write operation. However, during implementation of the flash write method of the present invention, signal TM would result in the EOFF signal being selected by the multiplexer 73 and, in turn, controlling the turning on and shutting off of the equalizer with the EQU signal.

FIG. 9 also depicts the circuitry that would control the PSET and NSET signals. During normal operation, multiplexer 71 would allow the normal timing signal to control. This, in turn, would transit through inverter 79 and turn on PFET transistor 75 sending the PSET signal high. In turn, multiplexer 72 would allow the normal timing to turn on NFET transistor 76 which, in turn, sends the NSET signal low at the appropriate time. However, during use of the flash write mode, signal TM would cause multiplexer 71 and 72 to accept the SON signal. The SON signal then would control the turning on and turning off of the PSET and the NSET signals. The SON signal on the way to the PSET line transits through a delay circuit D3, and an AND gate 80. This arrangement provides for the required delay in the PSET signal going high after the NSET signal goes low.

Figure 10:
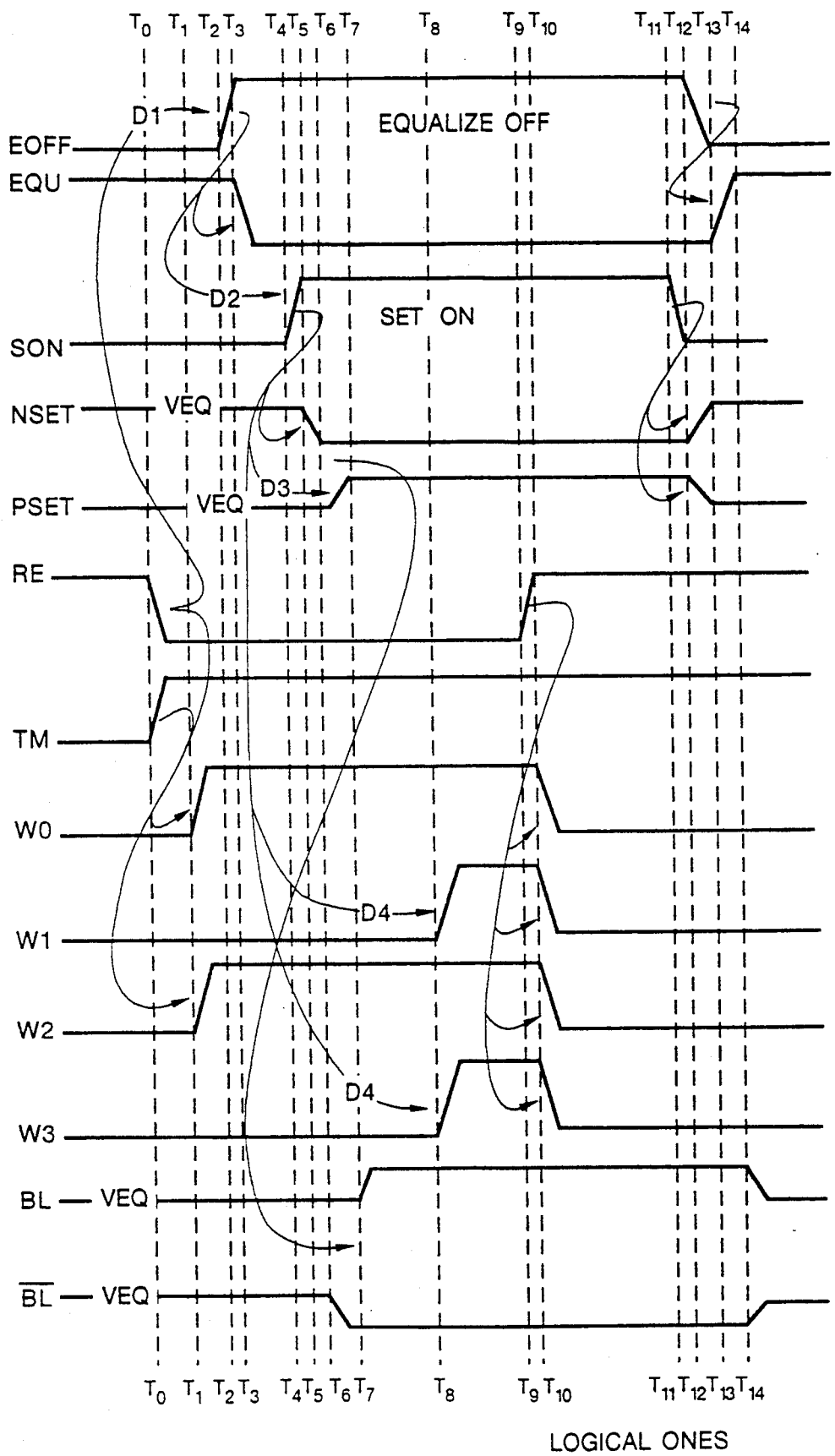
FIG. 10 presents a timing diagram depicting a sequence of signals generated during implementation of the present invention using the circuitry shown in FIG. 6, 7, 8, and 9 to charge the memory cells of the memory array with logical 1's.

FIG. 10, very similar in most respects to FIG. 4, provides a timing diagram of the signals which would allow the flash writing of logical 1's, with the method of the present invention into the memory cells of the memory array using the circuitry of FIGS. 6, 7, 8 and 9. At time $T_0$, after the equalization circuitry and signal EQU activate on receipt of the EOFF signal, the row select signal RE and the test mode signal TM activate. A logical 1 entering decoder 61 of FIG. 8, in this case, would select all of the even word lines. This in conjunction with signal TM entering decoder 62 would allow for selection of all even word lines which then become active at, time $T_1$ (FIG. 10). However, due to delay circuitry D1 (FIG. 7) the EOFF signal will not activate until time $T_2$ after the word lines have gone on. Subsequently, at time $T_3$ the equalization signal would go low shutting off the equalizer. Thus, turning on of the even word lines before the equalizer shuts off results, as required by the method of the present invention.

Subsequently, at time $T_4$, as a result of delay circuitry D2, the SON signal (FIG. 10) goes high. The SON signal then, by means of the circuitry depicted in FIG. 9, first results in the NSET signal going low and then subsequently, as a result of delay circuitry D3 (FIG. 9), the PSET signal goes high at time $T_7$, after the NSET signal has gone low as required by the method of the present invention.

Referring to FIG. 10, as a result of delay circuit D4 (FIG. 8), the SON signal activated at time $T_4$ finally enters decoder 61 of FIG. 8 at or about time $T_8$ and activates the odd word lines. Subsequently, at time $T_9$, the row select signal $\overline{RE}$ goes high with he result that at time $T_{10}$ all word lines shut off. At this time, the cells of the memory array are now charged to a logical 1. The cells of the true bit lines are charged to a high or 1 and the cells of the complementary bit lines are charged to a low or 0.

At time $T_{11}$ the SON signal goes low which results in the NSET signal and PSET signal returning to an equalized state. At time $T_{12}$ the EOFF signal goes low and turns on the equalization signal at time $T_{13}$ which brings the bit lines BL and $\overline{BL}$ back to an equalized state.

Figure 11:
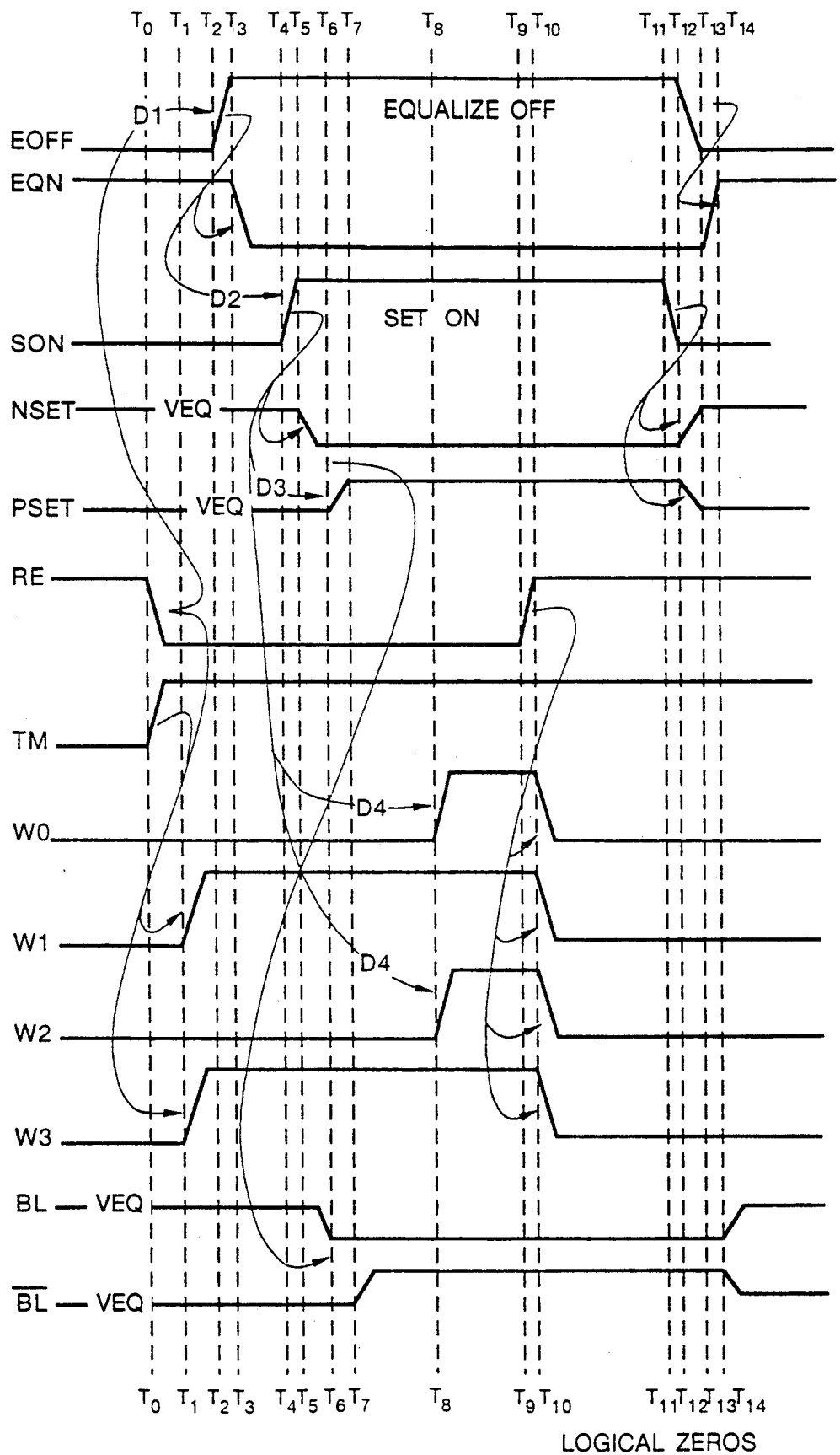
FIG. 11 presents a timing diagram depicting a sequence of signals generated during implementation of the present invention using the circuitry shown in FIGS. 6, 7, 8, and 9 to charge the cells of the memory array with logical 0's.

FIG. 11 illustrates the sequence of signals necessary to write logical 0's to all of the memory cells of the memory array. A comparison of FIG. 11 to FIG. 10 will reveal that they are identical with only two exceptions. First, the odd word lines activate at time $T_1$ and, second, the even word lines activate at time $T_8$. The results from the fact that decoder 61 (FIG. 8) receives a 0 instead of a 1 over line A0. Consequently, all of the odd word lines turn on initially. Therefore, the even word lines would not turn on until the SON signal enters decoder 61 after passing through delay D4.

While the invention has been particularly shown and described with reference to preferred embodiments thereof, it will be understood by those skilled in the art that changes in form and details may be made therein without departing from the spirit and scope of the invention.

We claim:

1. A method for simultaneously setting voltages in a plurality of memory cells of an integrated circuit memory module comprising:
   turning on a first set of word lines, each controlling the connection of a cell of a first set of memory cells to a first bit line of a pair of bit lines;
   equalizing the voltage between the bit lines of the bit line pair so that charge on the first bit line of the bit line pair is higher than charge on the second bit line of the bit line pair; and turning on a sense amplifier attached to the bit line pair to sense the difference in charge between the bit line pair and to charge the first set of memory cells.

2. The method of claim 1 further comprising the step of shutting off the first set of word lines after the first set of memory cells are charged.

3. The method of claim 2 further comprising the step of turning on a second set of word lines which control connection of a second set of memory cells to the second bit line of the bit line pair after the first set of memory cells are charged and prior to shutting off the first set of word lines.

4. The method of claim 3 further comprising the steps of shutting off the second set of word lines and the first set of word lines, and then shutting off the sense amplifier so that charge induced in the memory cells is retained.

5. The method of claim 1 wherein the step of equalizing is terminated after the first set of word lines is turned on but before the sense amplifier is turned on.

6. Apparatus for flash writing to a plurality of memory cells of a semiconductor memory device comprising:
   a paired first bit line and second bit line connected to a sense amplifier and equalization means;
   a first set of word lines controlling connection of the first bit line to a first plurality of memory cells;
   a second set of word lines controlling connection of the second bit line to a second plurality of memory cells;
   means for turning on the first set of word lines while keeping the second set of word lines shut off;
   means for keeping the equalization means on while the first set of word lines turn on and then shutting off the equalization means;
   means for turning on the sense amplifier after the equalization means shuts off; and
   means for subsequently turning off the first set of word lines.

7. The apparatus of claim 6 further comprising means for turning on the second set of word lines after the sense amplifier has turned on and means for simultaneously turning off the second set of word lines and the first set of word lines.

8. The apparatus of claim 6 wherein the semiconductor memory device comprises a DRAM.

9. The apparatus of claim 6 wherein the means for turning on the sense amplifier comprises means for first inducing the sense amplifier to drain charge from the paired bit lines and then inducing the sense amplifier to charge the paired bit lines.

10. The apparatus of claim 6 wherein the means for turning on the sense amplifier comprises means for generation of a signal to turn on and then turn off the sense amplifier.

11. The apparatus of claim 10 wherein the means for generation of a signal for turning on the sense amplifier comprises means to first induce the sense amplifier to drain charge from the paired bit lines and then to charge the paired bit lines.

12. The apparatus of claim 10 wherein the means for generation of a signal comprises a test mode decoder.

13. The apparatus of claim 6 wherein the means for keeping the equalization means on until the first set of word lines turns on comprises means for generating a signal to control the turning on and shutting off of the equalization means.

14. The apparatus of claim 13 wherein the means for generating a signal comprises a test mode decoder.

15. The apparatus of claim 6 wherein the means for turning on the first set of word lines comprises means for generating a signal and combining the signal with an appropriate portion of an address signal to select the word lines.

* * * * *